(12) United States Patent
Yokoyama et al.

(10) Patent No.: US 7,279,970 B2
(45) Date of Patent: Oct. 9, 2007

(54) FEEDBACK CIRCUIT

(75) Inventors: Kenji Yokoyama, Tokyo (JP); Yasuo Yamada, Shizuoka-ken (JP); Hiroshi Ogawa, Shizuoka-ken (JP)

(73) Assignee: Flying Mole Corporation (JP)

( * ) Notice: Subject to any disclaimer, the term of this patent is extended or adjusted under 35 U.S.C. 154(b) by 170 days.

(21) Appl. No.: 11/200,056

(22) Filed: Aug. 10, 2005

(65) Prior Publication Data

US 2006/0044059 A1   Mar. 2, 2006

(30) Foreign Application Priority Data

Aug. 24, 2004   (JP) ............................. 2004-244140

(51) Int. Cl.
  *H03F 1/34* (2006.01)
(52) U.S. Cl. ....................................... 330/99; 330/103
(58) Field of Classification Search ................. 330/98, 330/99, 100, 103
  See application file for complete search history.

(56) References Cited

U.S. PATENT DOCUMENTS

| | | | |
|---|---|---|---|
| 5,345,165 A | 9/1994 | Froeschle et al. ........... 323/284 |
| 5,410,592 A | 4/1995 | Wagner et al. .............. 379/388 |
| 6,249,182 B1 | 6/2001 | Pullen ........................ 330/10 |
| 6,441,685 B1 | 8/2002 | MacMillan .................. 330/10 |
| 6,566,947 B2* | 5/2003 | Gorcea ........................ 330/75 |
| 6,642,696 B2 | 11/2003 | Tateishi ..................... 323/222 |
| 6,744,318 B2 | 6/2004 | Yokoyama et al. ......... 330/251 |

* cited by examiner

*Primary Examiner*—Steven J. Mottola
(74) *Attorney, Agent, or Firm*—Bacon & Thomas, PLLC

(57) ABSTRACT

For reducing various adverse effects due to provision of a low-pass filter, while suppressing an oscillation generated therein, there is provide a feedback circuit, having at least one operational amplifier, having a low-pass filter in an output portion thereof, for feeding a signal from the output portion back thereto, including: a first feedback circuit portion for negatively feeding a signal from an input terminal of the low-pass filter back to an inverted input terminal of the operational amplifier; and a second feedback circuit portion for negatively feeding a signal from an output terminal of the low-pass filter back to the inverted input terminal of the operational amplifier. In such the structure, the second feedback circuit portion is preferably provided with two sets of a first feedback operational amplifier and a second feedback operational amplifier, and the first feedback operational amplifier has a non-inverted input terminal connected to a predetermined input signal and has an inverted input terminal connected to the output terminal of the low-pass filter.

1 Claim, 6 Drawing Sheets

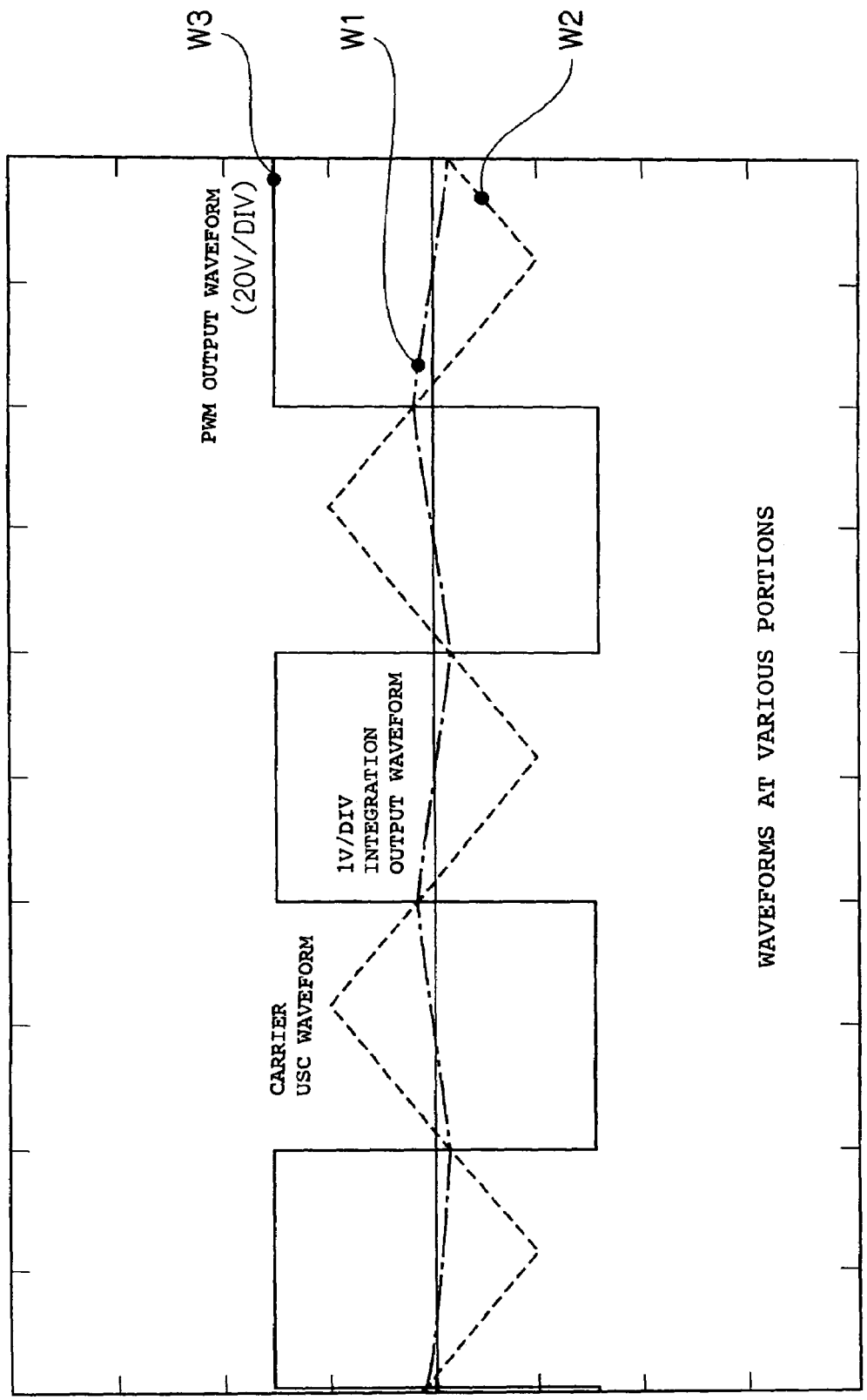

US 7,279,970 B2

FEEDBACK CIRCUIT

CROSS-REFERENCE TO RELATED APPLICATION

This application claims, under 35 USC 119, priority of Japanese Application No. 2004-244140 filed Aug. 24, 2004.

BACKGROUND OF THE INVENTION

The present invention relates to a feedback circuit, being applicable to, for example, a digital amplifier, etc.

In the recent years, digitalization of power amplifiers (hereinafter, amplifiers) has been quickly advanced. In particular, digitalization is remarkably accepted in the field of an audio-amplifier. Apparatuses of installing such the digital amplifier (i.e., so-called switching amplifier) include a DVD player, a mini-component, a television receiver, a personal computer, a mobile telephone, etc.

With such the digital amplifier, since a digital waveform in a rectangular shape can be obtained therefrom, including distortion of a high-frequency region through switching elements, which are on-off controlled, complementarily, the digital waveform must be converted into an analogue waveform to be supplied to a speaker, etc., for example, by removing such the high-frequency distortion therefrom. This conversion is achieved by use of a low-pass filter (LPF), for example.

Conventionally, a filter of a second order of LC or higher, including a coil and a capacitor, is applied as the low-pass filter.

By the way, the above-mentioned low-pass filter may have various kinds of adverse effects, such as fluctuation on the frequency characteristics thereof due to an impedance with respect to a load, for example, the speaker mentioned above; an increase of the distortion due to a coil (i.e., a LPF coil) within the low-pass filter; and degradation or deterioration on the damping factor thereof.

For reducing such the adverse effects, a negative feedback can be considered to be effective, being taken from an output terminal of the low-pass filter (e.g., the junction point between the low-pass filter and the load (such as, the speaker)). However, if the low-pass filter is a filter of the second order of LC or higher, then the phase is delayed by 180° even only in this portion, and therefore it is impossible to adopt such the negative feedback, in general, because the negative feedback under such the condition results in an oscillation.

SUMMARY OF THE INVENTION

An object, according to the present invention, is to provide a feedback circuit, having at least one operational amplifier, having a low-pass filter in an output portion thereof, for feeding a signal from the output portion back thereto, including: a first feedback circuit portion for negatively feeding a signal from an input terminal of the low-pass filter back to an inverted input terminal of the operational amplifier; and a second feedback circuit portion for negatively feeding a signal from an output terminal of the low-pass filter back to the inverted input terminal of the operational amplifier.

BRIEF DESCRIPTION OF THE DRAWINGS

Those and other objects, features and advantages of the present invention will become more readily apparent from the following detailed description when taken in conjunction with the accompanying drawings wherein:

FIG. 6 is a graph showing a simulation result of the operation thereof, in relation to the embodiment.

DESCRIPTION OF THE PREFERRED EMBODIMENTS (A) First Embodiment

Hereinafter, explanation will be fully given about an embodiment of applying the negative feedback circuit, in particular, into a digital amplifier, by referring to the attached drawings.

(A-1) Structure of the Embodiment

Figure 1:
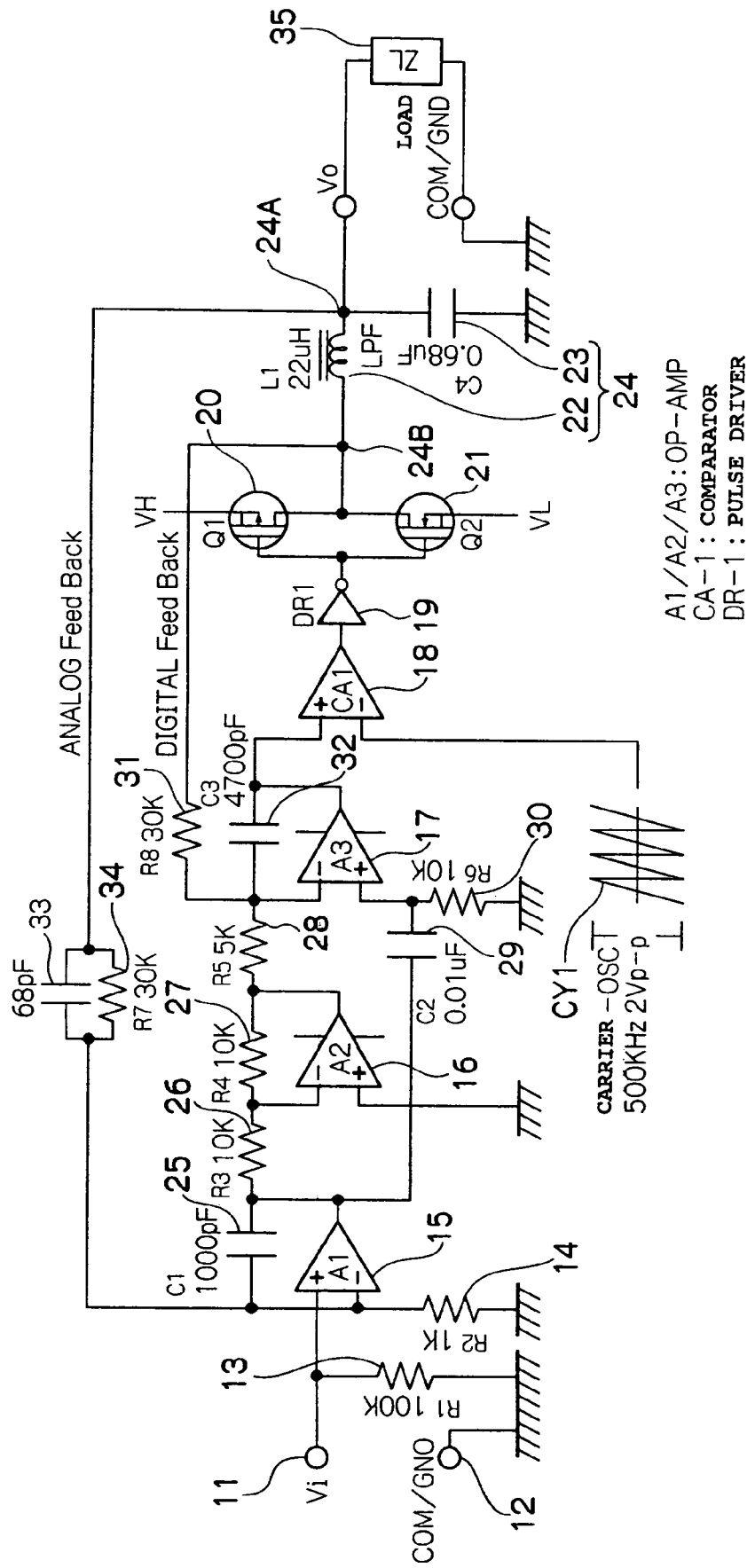
FIG. 1 is a brief structural view showing circuitry of a digital amplifier, according to one embodiment of the present invention.

FIG. 1 shows an example of the entire structure of a digital amplifier 10, according to the present embodiment.

In this FIG. 1, the digital amplifier 10 includes input terminals 11 and 12, resistors 13, 14, 26 to 28, 30, 31 and 34, operational amplifiers 15 to 17, a comparator 18, a pulse driver 19, FETs (Field-Effect Transistors) 20 and 21, capacitors 23, 25, 29, 32 and 33, and a load 35.

An audio signal, Vi is supplied across the input terminals 11 and 12 of this digital amplifier 10, when the digital amplifier 10 is for audio-use.

A non-inverted input terminal of the operational amplifier 15 through the resistor 13 which is grounded is connected to the input terminal 11. The resistor 14 which is grounded, the capacitors 25 and 33, and the resistor 34 are connected to an inverted input terminal of the operational amplifier 15. With this, the negative feedback can be achieved through the inverted input terminal, which is distinctive or characteristic feature of the present embodiment.

Namely, the negative feedback is obtained from a junction point 24A of a low-pass filter (LPF) 24 having a coil 22 and the capacitor 23, which is disposed in an output portion of the digital amplifier 10, through the above-mentioned capacitor 33 and the resistor 34 and also a non-inverted input terminal of the operational amplifier 15. Although the LPF 24 in the example of this figure is a filter of the first-order, the LPF 24 may be a filter of the second order or higher, as motioned above.

The negative feedback is also provided to the operational amplifier 34 from the junction point 24B, at an input side of the LPF 24. This provides a double negative feedback. However, conventionally, the feedback is provided only from the input-side conjunction point 24B, in the ordinary digital amplifier.

The above-mentioned operational amplifier 15 and the operational amplifier 16 are constituent elements for building up the negative feedback from the output-side conjunction point 24A.

To the inverted input terminal of the operational amplifier 15 mentioned above are connected the resistors 26, 27 and 28, and the capacitor 32, through the capacitor 25 motioned above, in this order, while to the output terminal of the operational amplifier 15 are connected the junction point between the capacitor 25 and the resistor 26 and also the capacitor 29.

Those capacitor 29 and resistor 30 build up a time-constant circuit together, and the time-constant circuit is connected to the non-inverted input terminal of the operational amplifier 17.

The non-inverted input terminal of the operational amplifier 16 is connected to the ground, while the inverted input terminal thereof is connected to the junction point between the resistors 26 and 27. In addition, an output terminal of the operational amplifier 16 is connected to the junction point between the resistors 27 and 28.

An output terminal of the operational amplifier 17 is connected to the junction point between the capacitor 32 and the non-inverted input terminal of the comparator 18, and between the output terminal and the inverted input terminal of the operational amplifier 17 is inserted the capacitor 32 mentioned above, in the configuration thereof.

The comparator 18 is a comparator of a type of applying operation amplifiers therein, and since the inverted input terminal thereof is supplied with a carrier signal CY1, which vibrates or oscillates at a predetermined frequency (for example, 500 kHz), the signal outputted from the output terminal of the comparator 18 also oscillates depending upon the frequency, when a signal having an absolute value smaller than a peal voltage of the carrier signal CY1 is supplied at the non-inverted input terminal of the comparator 18. A triangular wave, mentioned later, may be applied as the carrier signal CY1.

A driver 19 is connected to the output terminal of the comparator 18. The driver 19 drives a complementary MOS (CMOS) structured switching circuit, which is constructed with FETs 20 and 21. Those FETs 20 and 21 are turned on and off, alternately, through being driven by means of the driver 19; therefore, a PWM (i.e., Pulse-Width Modulated) signal, having a rectangular waveform, is supplied to the junction point 24B at the input side of the LPF 24 mentioned above.

Thus, when the FET 20 is turned on while the FET is OFF, voltage VH is supplied to the input-side junction point 24B, on the other hand, when the FET 20 is turned OFF while the FET 21 is ON, then voltage VL is supplied to that input-side junction point 24B. Herein, the voltage VH is a voltage of a high-level side, which is connected to the source of the FET 20, for example, while the voltage VL is a voltage of a low-level side, which is connected to the source of the FET 21.

Accordingly, the digital signal (i.e., the PWM signal) having the rectangular waveform is fed back from the input-side junction point 24B. Further, an analog signal, which is removed the distortion in high-frequency region through the LPF 24 therefrom, is supplied to the load 35, and at the same time, the analog signal is fed back from the output-side junction point 24A mentioned above.

The load 35 may be a speaker, for example, as mentioned above.

Hereinafter, explanation will be given about the operation of the present embodiment having such the structures as mentioned above, by referring to FIGS. 2 through 6, showing the results of simulations thereof.

(A-2) Operation of the Embodiment

Figure 2:
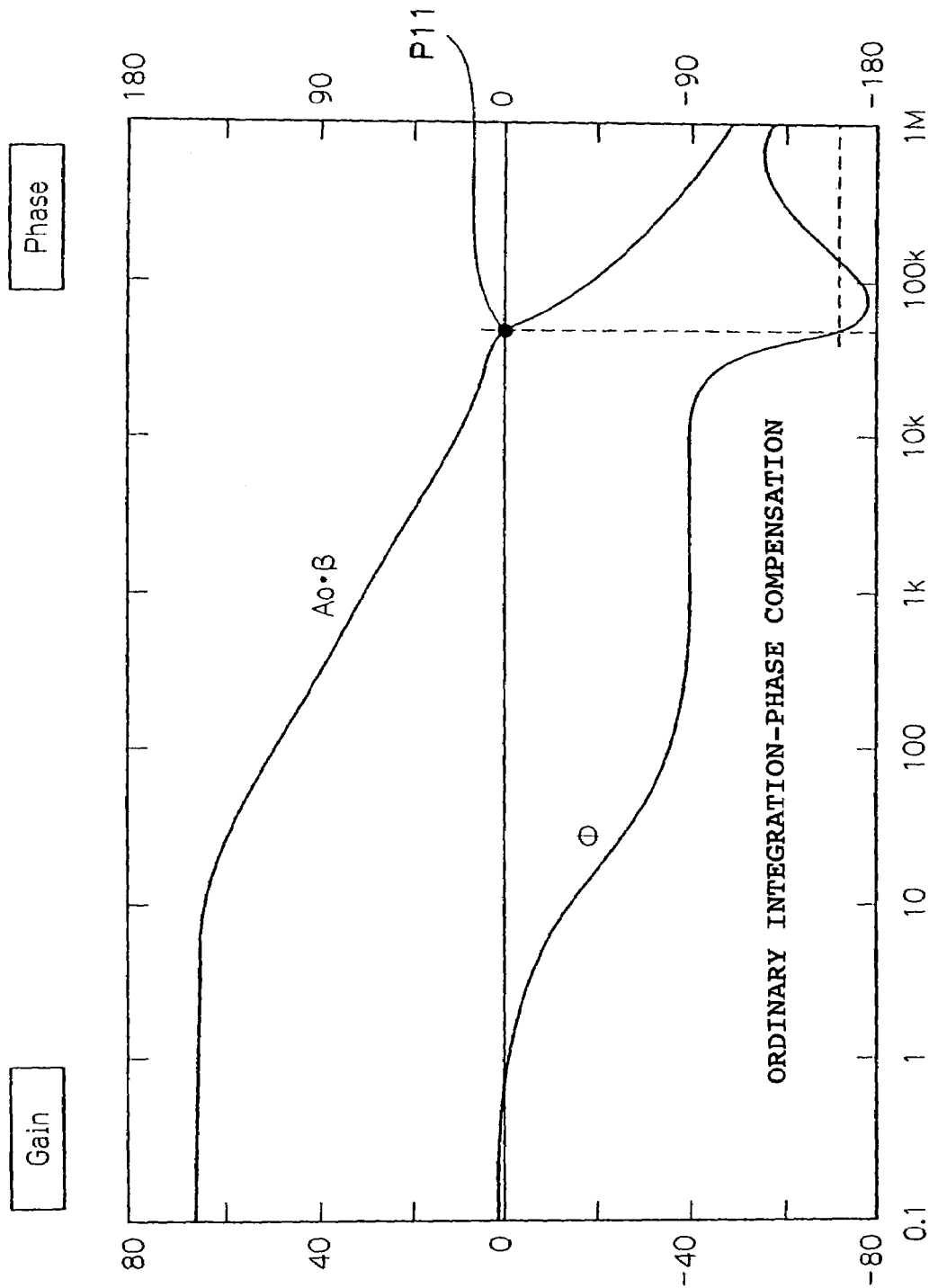
FIG. 2 is a graph showing a simulation result of the operation thereof, in relation to the embodiment.

FIG. 2 shows a result of simulation for dealing with the normal phase compensation.

In FIG. 2, at a point P11 where A0·β characteristics (i.e., characteristics of a signal turning back to the comparator 18) is 0 dB, the phase Φ is delayed by −170°, approximately. This means the possibility of oscillation is very high. For suppressing the oscillation, there is a necessity of reducing an amount of that feedback; i.e., the A0·β characteristic is 0 dB at 10 kHz or more or less than that, for example.

Figure 3:
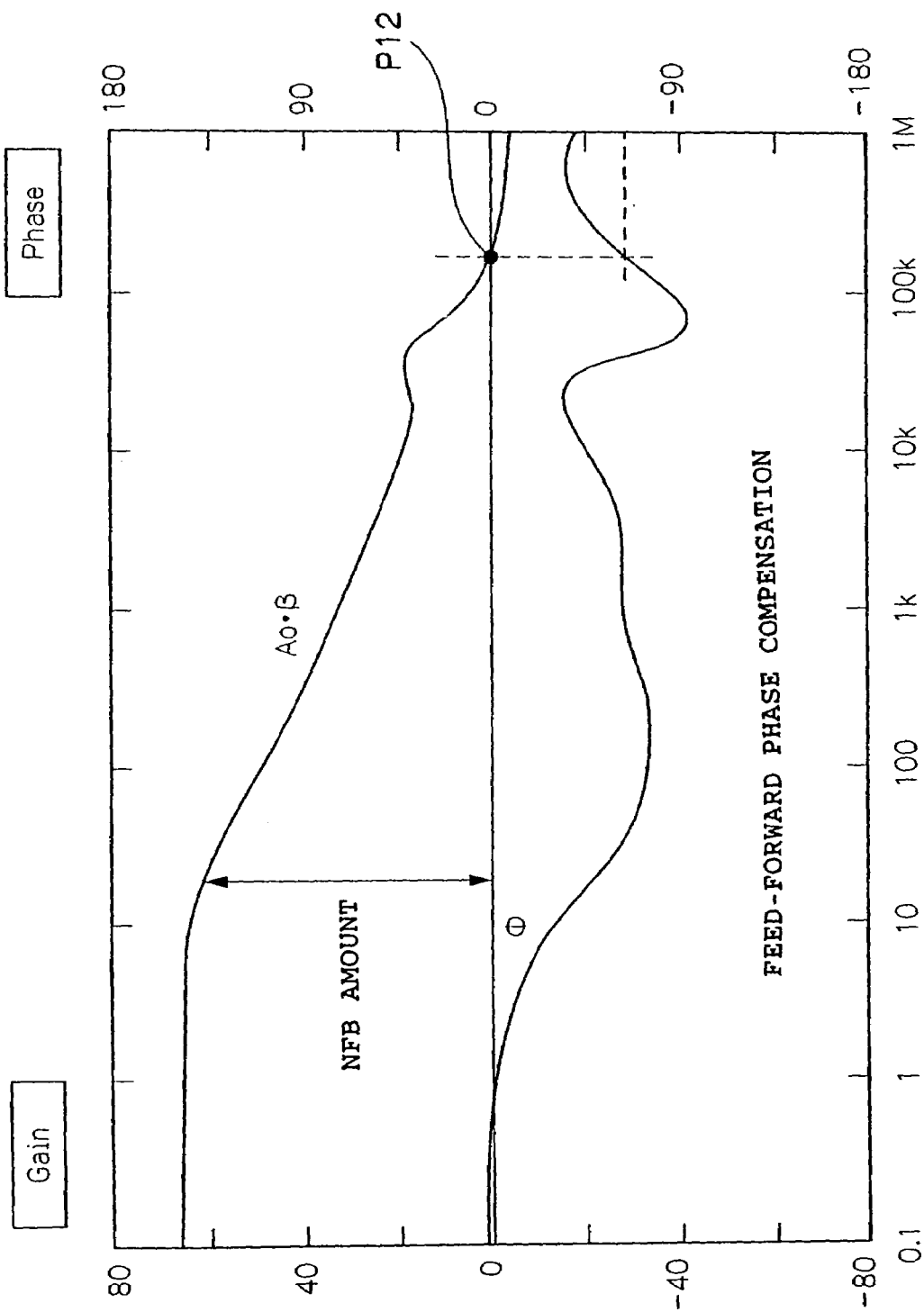
FIG. 3 is a graph showing a simulation result of the operation thereof, in relation to the embodiment.

FIG. 3 shows a result of simulation, in particular, in the case of conducting a feed-forward within the feedback loop, by adding one capacitor within the feedback loop, upon the digital amplifier having the circuit-constant same as that shown in FIG. 2. This capacitor corresponds to the capacitor 29 shown in FIG. 1. With this addition of the capacitor, the circuit is completely same as that of the digital amplifier 10 shown in FIG. 1.

Comparing to FIG. 2, the point P12 where the A0·β characteristics comes down to 0 dB can be extended up to 200 kHz or less. However, the phase delay at that point P12 lies within −90°. Therefore, there is no possibility of the oscillation. Thus, it is possible to apply the negative feedback, and thereby obtaining a stable operation as the digital amplifier.

Figure 4:
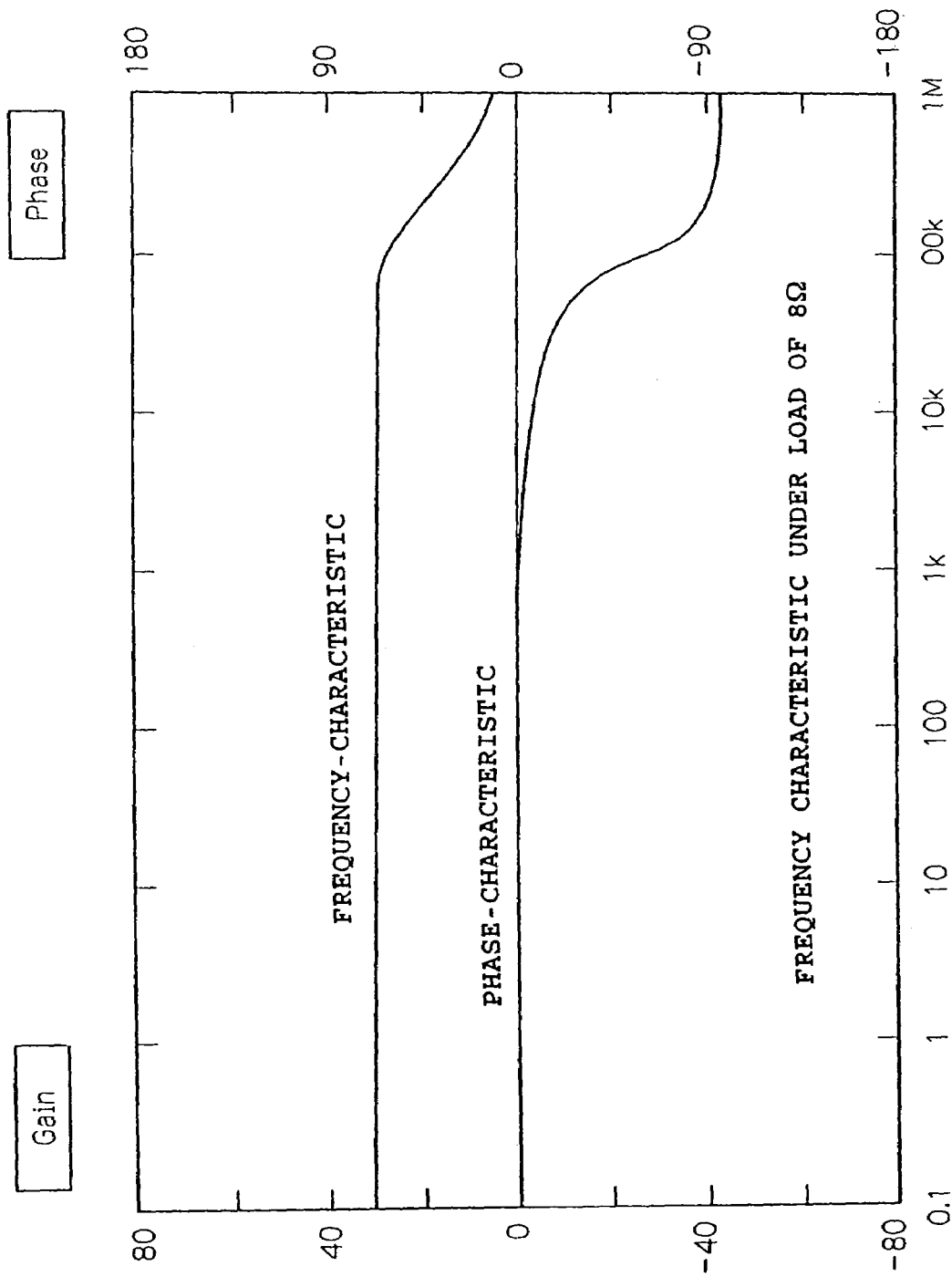
FIG. 4 is a graph showing a simulation result of the operation thereof, in relation to the embodiment.

FIG. 4 shows overall characteristics after conducting NFB (Negative Feed Back) onto the digital amplifier having the circuit constant as shown in FIG. 3. In this instance, the load 35 has a value of 8 Ω, for example.

Figure 5:
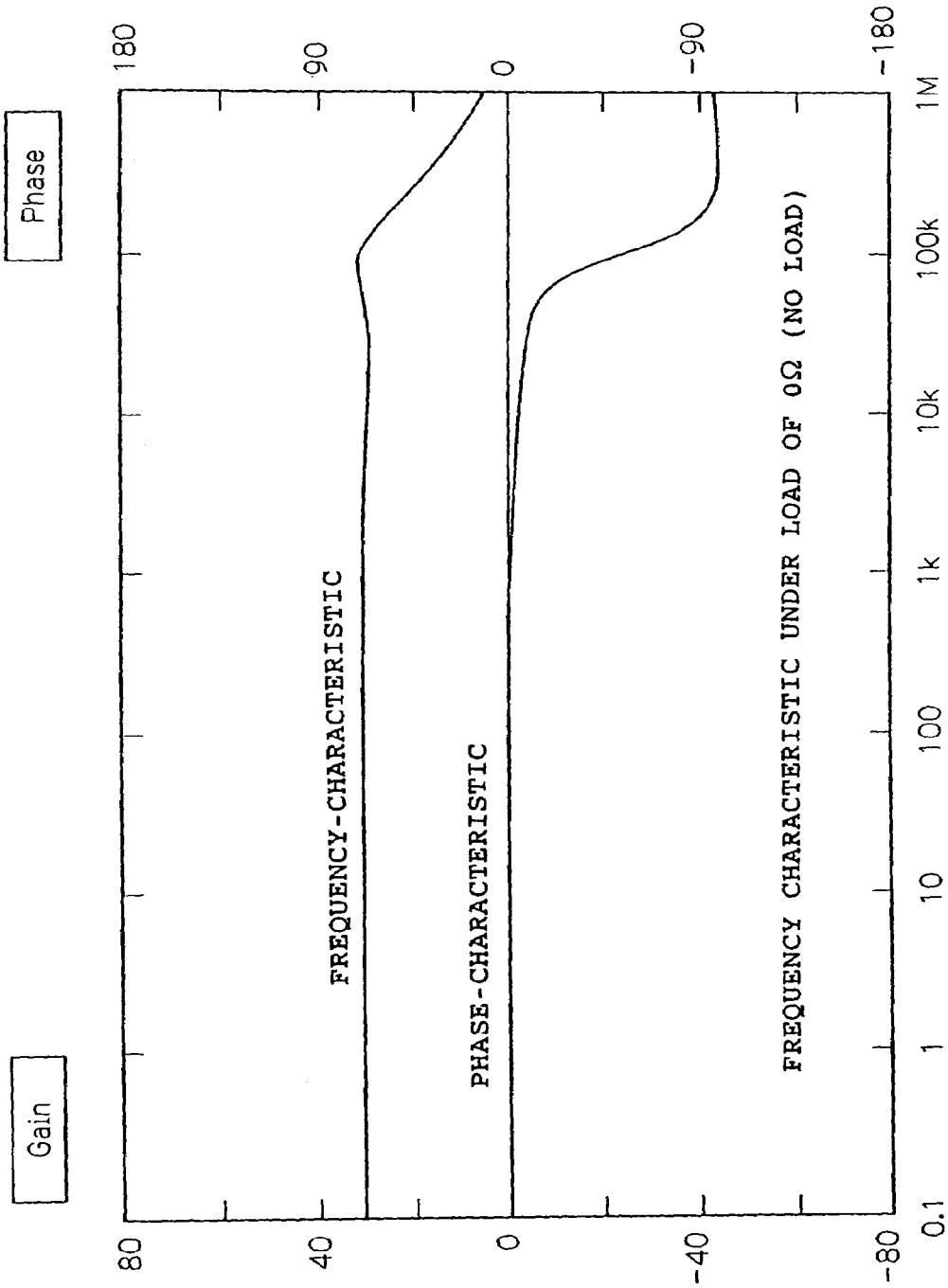
FIG. 5 is a graph showing a simulation result of the operation thereof, in relation to the embodiment.

FIG. 5 shows the characteristics under no-load condition. Excepting that the value of the load 35 is 0 Ω, the circuit is same as that shown in FIG. 4, including the circuit constants thereof. From the result of this simulation, no oscillation occurs even when the load is zero (under no-load condition); therefore, a stable operation can be obtained.

FIG. 6 shows waveforms at various positions within the digital amplifier 10 shown in FIG. 1.

In FIG. 6, the vertical axis depicts 0.5 us/div. (herein, assuming that the frequency of the carrier signal CY1 mentioned above is 500 kHz), and a waveform W1 crossing over a zero-line by several times in the vicinity thereof is an output waveform of the LPF 24. In a case where the above-mentioned voltages are; VH is 30 volts and VL is −30 volts, for example, then the PWM rectangular waveform of 60VP-P (i.e., 60 volts, peak-to-peak) is supplied to the input-side junction point 24B, and this PWM rectangular waveform can be reduced down to the level as shown in FIG. 6.

Also from FIG. 6, it is apparent that the pulse width of the PWM rectangular waveform is determined at the point where the triangular waveform W2 indicative of the carrier signal CY1 intersects the zero-line. This PWM rectangular waveform is supplied from the switching circuit, which is constructed with the FETs 20 and 21, to the input-side junction point 24B mentioned above.

(A-3) Effect(s) of the Embodiment

According to the present embodiment, with provision of the negative feedbacks, not only from the input-side junction point (24B) of the LPF (24), but also from the output-side junction point (24A), it is possible to reduce the various adverse effects due to the LPF, while suppressing the oscillation, and thereby to improve the characteristics or performances of the digital amplifier (10).

For example, the various adverse effects can be reduced, such as, the fluctuation on the frequency characteristics caused due to the load impenence with respect to the load (35), an increase of distortion due to the coil (22) within the LPF, and the deterioration of the dumping factor, etc.

(B) Other Embodiment(s)

Although many numbers of various time-constants are shown, in the details thereof, as the examples in the embodiment mentioned above, of course, the present invention may also be applicable to other time-constants than that shown in the examples.

In the embodiment mentioned above, although the switching circuit is constructed from a pair of FETs, i.e., of the one-stage structure, of course, it may be made up with a two-stage structure or a multi-stage structure, in the place thereof. Increasing the number of stages of this switching circuit enables the capacity of driving the load to be increased.

Further, regardless of the embodiment mentioned above, according to the present invention, it is also understood that other switching elements other than the FET can be applied therein.

Moreover, regardless of the embodiment mentioned above, the present invention may be also applicable to an electric power source circuit (such as, a DC-DC converter), etc.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A feedback, having a low-pass filter in an output portion thereof, for feeding a signal from said output portion back thereto, comprising:

a first feedback circuit portion for negatively feeding a signal from an input terminal of said low-pass filter back to an inverted input terminal of an operational amplifier; and a second feedback circuit portion for negatively feeding a signal from an output terminal of said low-pass filter back to the inverted input terminal of said operational amplifier, wherein:

said second feedback circuit portion is provided with a first feedback operational amplifier and a second feedback operational amplifier, said first feedback operational amplifier has a non-inverted input terminal connected to a predetermined input signal and has an inverted input terminal connected to the output terminal of said low-pass filter, said first feedback operational amplifier has an output terminal connected to the inverted input terminal of said second feedback operational amplifier and the non-inverted input terminal of said operational amplifier, said second feedback operational amplifier has an output terminal connected to the inverted input terminal of said operational amplifier through a resistor, and the output terminal of said first feedback operational amplifier and the non-inverted input terminal of said operational amplifier have a time-constant circuit disposed therebetween.

* * * * *

UNITED STATES PATENT AND TRADEMARK OFFICE
CERTIFICATE OF CORRECTION

| | |
|---|---|
| PATENT NO. | : 7,279,970 B2 |
| APPLICATION NO. | : 11/200056 |
| DATED | : October 9, 2007 |
| INVENTOR(S) | : Kenji Yokoyama et al. |

It is certified that error appears in the above-identified patent and that said Letters Patent is hereby corrected as shown below:

Column 5, line 32 (claim 1, line 1) "feedback" should read -- feedback circuit --

Signed and Sealed this

Fourth Day of March, 2008

JON W. DUDAS
*Director of the United States Patent and Trademark Office*